(12) United States Patent
Watson et al.

(10) Patent No.: US 11,365,118 B1
(45) Date of Patent: Jun. 21, 2022

(54) ACOUSTIC TRANSDUCER ASSEMBLY

(71) Applicant: Knowles Electronics, LLC, Itasca, IL (US)

(72) Inventors: Joshua Watson, Naperville, IL (US); Adam Ariffin, Wheaton, IL (US)

(73) Assignee: Knowles Electronics, LLC, Itasca, IL (US)

( * ) Notice: Subject to any disclaimer, the term of this patent is extended or adjusted under 35 U.S.C. 154(b) by 0 days.

(21) Appl. No.: 17/110,404

(22) Filed: Dec. 3, 2020

(51) Int. Cl.
*H04R 19/00* (2006.01)
*B81B 7/00* (2006.01)
*H04R 19/04* (2006.01)

(52) U.S. Cl.
CPC ........... *B81B 7/0064* (2013.01); *H04R 19/04* (2013.01); *B81B 2201/0257* (2013.01); *B81B 2201/0264* (2013.01); *B81B 2201/0278* (2013.01); *B81B 2201/0285* (2013.01); *B81B 2207/012* (2013.01); *H04R 2201/003* (2013.01)

(58) Field of Classification Search
CPC .......... B81B 7/0064; B81B 2201/0257; B81B 2201/0264; B81B 2201/0278; B81B 2201/0285; B81B 2207/012; H04R 19/04; H04R 2201/003
See application file for complete search history.

(56) References Cited

U.S. PATENT DOCUMENTS

| | | | | |
|---|---|---|---|---|
| 10,689,249 | B2 * | 6/2020 | Huang | B81B 7/0064 |
| 2008/0063232 | A1 * | 3/2008 | Song | H04R 19/005 381/355 |
| 2008/0283988 | A1 * | 11/2008 | Huang | B81B 7/0061 257/E23.18 |
| 2010/0200983 | A1 * | 8/2010 | Ono | H01L 23/552 257/E23.181 |
| 2012/0126347 | A1 * | 5/2012 | Yang | B81B 7/0064 438/118 |
| 2014/0044297 | A1 * | 2/2014 | Loeppert | H04R 1/086 381/355 |
| 2017/0057808 | A1 * | 3/2017 | Chang | B81B 7/0064 |
| 2018/0146302 | A1 * | 5/2018 | Chen | H04R 19/04 |

* cited by examiner

*Primary Examiner* — Matthew A Eason
(74) *Attorney, Agent, or Firm* — Loppnow & Chapa; Matthew C. Loppnow

(57) ABSTRACT

The present disclosure relates to a sensor assembly (100) comprising: a base (102) having a host-device interface (104), a lid (108) mounted on the base (102) to form a housing (110), the lid (108) having an insulative structural core (112) between an inner metal skin (114) and an outer metal skin (116); and a transduction element (118) disposed in the housing (112). Advantageously, the lid (108) of the sensor assembly (100) can help to minimize and reduce undesirable thermo-acoustic effects produced by external environmental conditions that may result in acoustic artifacts.

19 Claims, 4 Drawing Sheets

ACOUSTIC TRANSDUCER ASSEMBLY

FIELD OF THE DISCLOSURE

The present disclosure relates generally to microphones and more particularly to microphone assemblies, like MEMS microphones, having reduced susceptibility to environmental conditions that may produce acoustic artifacts.

BACKGROUND

Microphones are deployed in various types of electronic devices such as cellular phones, mobile devices, headsets, hands free systems, smart televisions, smart speakers, portable computers, etc. Such microphones typically include a transducer disposed within a housing, for converting sound waves into an electrical signal that represents the sound. Generally, temperature changes, radiation and other conditions external to the microphone can cause thermo-acoustic effects (e.g., temperature and air pressure changes) within the housing. In wireless communication devices, for example, some radio frequencies induce thermal-acoustic effects in microphones integrated with the device. These thermo-acoustic effects can be detected by the microphone transducer and can result in undesirable audio artifacts perceptible by the user. Other types of sensors may also be susceptible to undesirable effects caused by environmental conditions.

BRIEF DESCRIPTION OF THE DRAWINGS

The foregoing and other features of the present disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

Figure 1:
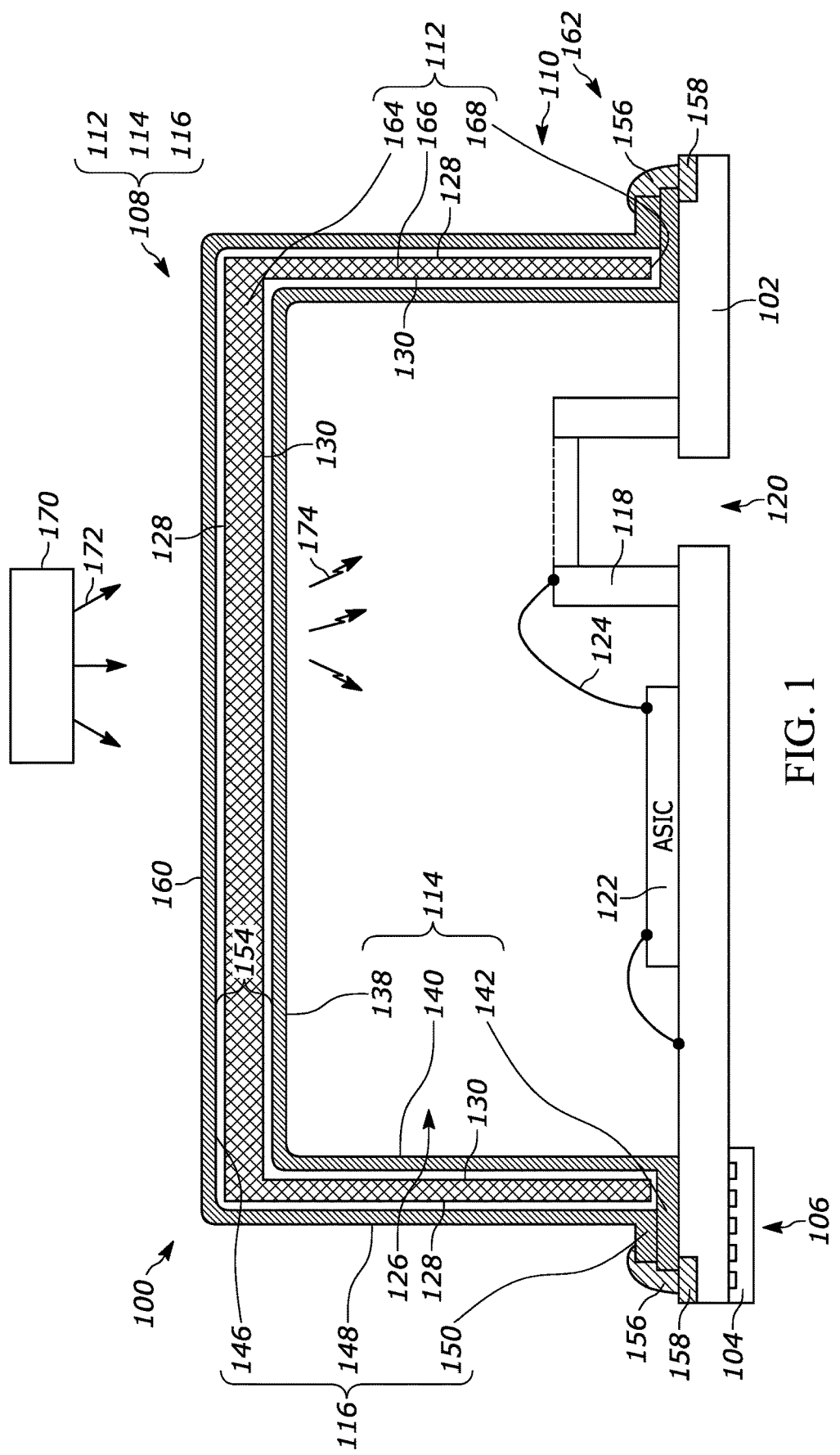
FIG. 1 is a side cross-sectional view of an acoustic transducer assembly in accordance with an illustrative embodiment.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and make part of this disclosure.

DETAILED DESCRIPTION

The present disclosure describes sensor assemblies having improved immunity to undesirable thermo-acoustic effects caused by environmental conditions other than a condition that the sensor is intended to detect. Such undesirable effects can be produced by environmental radio frequency (RF) energy, temperature fluctuations, etc. The sensor assembly generally comprises a transduction element disposed within a housing and configured to generate an electrical signal representative of a sensed condition for output to an integrated circuit of the sensor assembly. In some implementations, a housing of the sensor assembly comprises an augmented lid or cover that insulates a transducer and thereby contributes to reducing the thermo-acoustic effects as detailed below. The sensor assembly can be implemented as an acoustic sensor, a vibration sensor, a pressure sensor, a temperature sensor, or a humidity sensor, among others, and combinations thereof.

An acoustic transducer or microphone assembly is described below but the teachings are applicable to other types of sensors described herein. The acoustic transducer assembly can include a transduction element, an integrated circuit (IC), and a housing. The housing can enclose the transducer and the integrated circuit. The transducer can convert a sound into a signal electrically representing the sound and provide the electrical signal to the IC. The IC can process (e.g., amplify, buffer, filter, digitize, etc.) the signal and output processed signal at an external-device (e.g., host) interface of the sensor assembly. The housing generally protects and isolates the transducer and the IC from the effects of RF energy on the performance of the transducer assembly. The IC may output the processed audio signal to an external electrical device or host.

In one embodiment, the housing can include a lid and a base. The lid can include a structural core comprising an insulator between an inner metal skin and an outer metal skin. The structural core can be more electrically insulative and less thermally conductive than the inner and outer metal skins. The structural core can be a solid material, such as a mold, thermoplastic, thermoset, etc., a layered construction, tape, multi-layered, etc., a non-solid material, such as a lattice, weave, honeycomb, combinations of the above and the like, as detailed more fully herein. In microphone applications and other sensors, the housing includes a port, typically on the base or cover. In other implementations, for example, such as in some vibration sensors, the port may not be required.

The inner metal skin and/or the outer metal skin can be mechanically connected to the base and can have a predetermined spacing (distance apart, to provide a cup-shaped gap or volume configured to receive the structural core. The structural core can provide an insulated buffer between the inner metal skin and the outer metal skin to minimize the adverse effects caused by external heat sources (e.g., RF electromagnetic waves) incident on the outer metal skin that could adversely affect the performance of the sensor. Thus, since the inner metal skin is largely isolated from the environmental conditions, any undesirable thermo-acoustic effects are significantly reduced. Thus, in one embodiment, the lid can provide an acoustic transducer assembly and/or microphone assembly with thermal and acoustic isolation, which, in turn, enhances the quality, reliance, and reliability of such an assembly.

Referring to FIG. 1, an embodiment of an acoustic transducer assembly (ATA) 100 is shown. The ATA 100 can include: a base 102 (e.g., a substrate, such as a printed circuit board (PCB)) having a host-device interface 104 with for example a plurality of contacts 106; a lid 108 mounted on the base 102 to form a housing 110, the lid 108 having a structural core 112 between an inner metal skin 114 and an outer metal skin 116, the structural core more electrically insulative and less thermally conductive than the inner and outer metal skins; a MEMS transduction element 118 disposed in the housing 110 and acoustically coupled to a sound port 120 of the housing 110; an integrated circuit 122 disposed in the housing 110, the integrated circuit 122 electrically coupled to the MEMS transduction element 118 (shown via lead(s) 124), and to contacts 106 of the host-device interface 104.

In one embodiment, the lid 108 can provide an improved thermal insulation or barrier in connection with minimizing heat transfer from an external environment to the inner metal skin 114 and back volume 126 therein, for improved RF immunity with a minimal footprint. Advantageously, the lid (108) construction can help to minimize and reduce undesirable thermo-acoustic effects (e.g., mechanical vibrations and/or heating) resulting from external radiation (arrows) 172 from radiation element 170, in FIG. 1. The reduced radiation exposure (improved RF immunity) is shown as arrows 174.

As background, Eddy currents are excited on the outer metal skin 116 surface 160, resulting in induction heating, which is problematic. Further, the back volume 126 thermal fluctuations can cause pressure fluctuations that are detectable by transduction element 118. The lid 108 construction can provide improved RF immunity with the insulative structural core 112, by providing an insulation barrier reducing thermal conduction to the inner metal skin 114 and reducing thermal fluctuations in the enclosed or back volume 126, as shown as reduced radiation arrows 174.

The ATA 100 can be integrated with a cellular phone, mobile device, headset, hearing aid device, smart televisions, smart speakers, or any other type of host device. In an embodiment, the ATA 100 also includes an integrated circuit (IC) 122 that is disposed within the housing 110. The transduction element 118 and the IC 122 may be embodied as hardware components that are electrically coupled to each other through conductive wires or traces. In some embodiments, the ATA 100 can include additional components not shown in FIG. 1.

Figure 2:
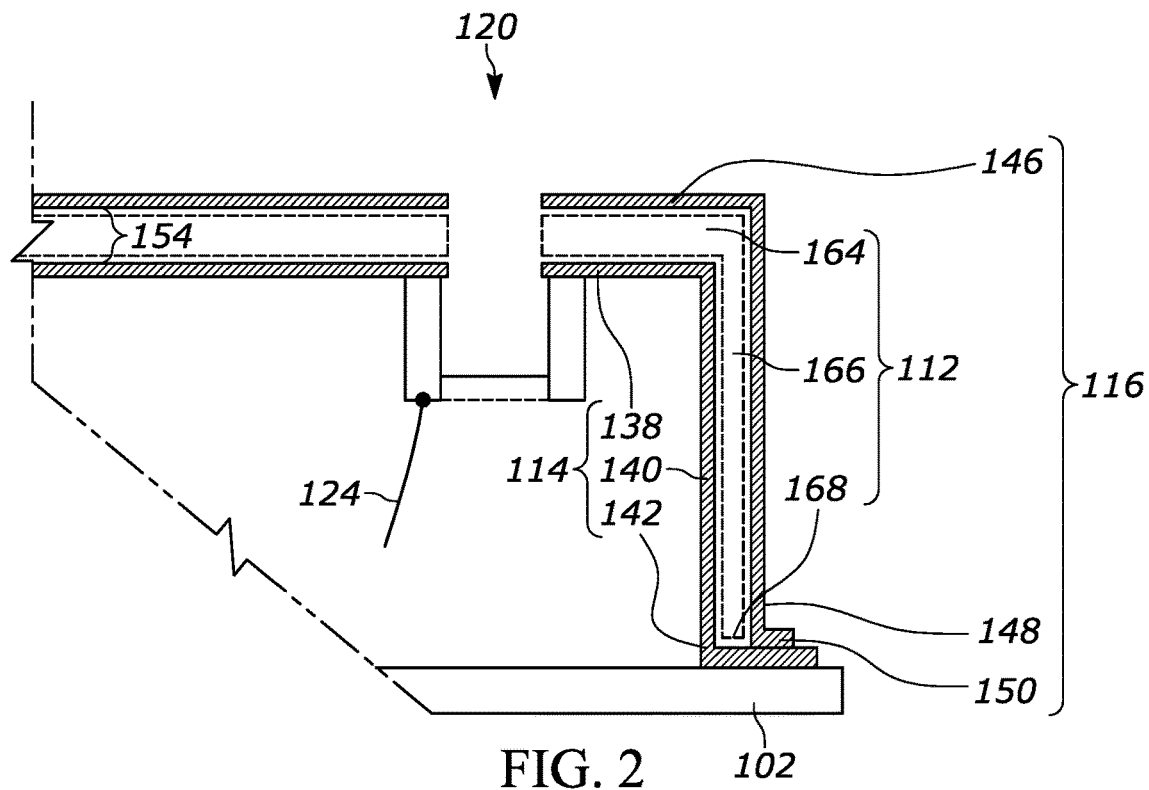
FIG. 2 is a partial top cross-sectional view of an acoustic transducer assembly in accordance with an illustrative embodiment.

As should be understood by those skilled in the art, the host-device interface 104 can be a surface-mount interface or can be in the form of leads for a through-hole interface. The transduction element 118 can be a capacitive, piezoresistive, resonant, or optical, among others. These and other suitable transduction elements can be fabricated as microelectromechanical systems (MEMS) devices. The sound port 120 can be located in the base 102 as shown in FIG. 1, for a bottom-port implementation, or on the lid 108 for a top-port implementation, as shown in FIG. 2. A transduction element 118, such as in the form of a MEMS die, can be mounted over the sound port 120. The integrated circuit or ASIC functions can include: impedance matching (buffering) or charge sampling; filtering; amplification; A/D (for digital mics); output signal protocol formatting (e.g., PDM, Soundwire) and the like, for example. In addition, other microphones, such as "smart mics", can include a separate DSP for higher order processing like voice recognition, noise suppression and authentication. The geometric shape of the lid 108 can vary widely based on the use case. By way of example, the lid 108 can be generally circular, cylindrical, square, octagon, or any other polygon shape or geometry having a use case.

Figure 4:
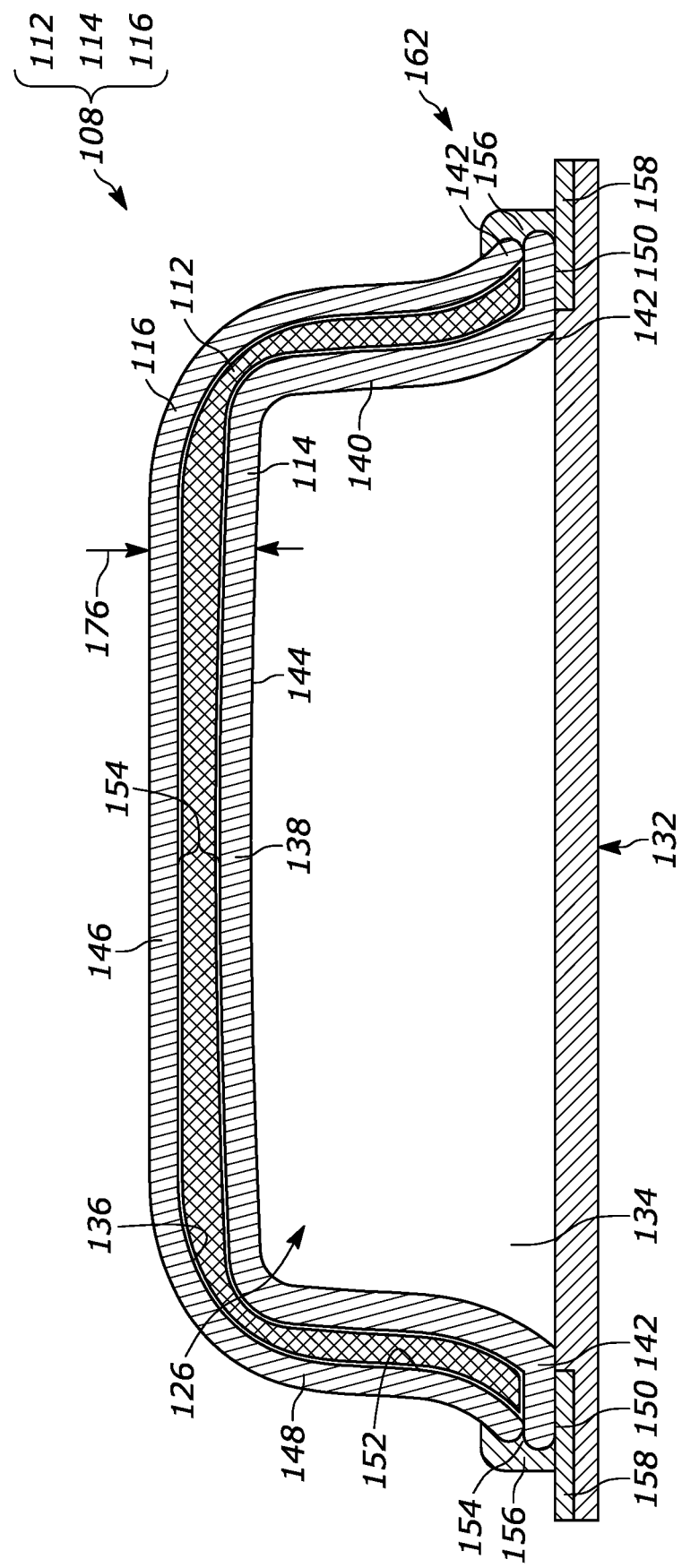
FIG. 4 is a is a sectional view along lines 4-4 in FIG. 3 view of an acoustic transducer assembly including a lid in accordance with an illustrative embodiment.

As should be understood by those skilled in the art, the lid 108 construction shown in FIGS. 1 and 4 involves engineering considerations and tradeoffs, based on a particular use case or application. For example, the lid 108 can be configured and adapted with a combined profile 176, to provide: (i) a desired 3-D footprint (ie., specific desired dimensions) or adherence to a desired overall footprint, such as defined by the housing 110; (ii) enhanced thermal and acoustic characteristics, value and isolation; and (iii) a desired back volume 126 (ie., specific dimensions) or adherence to a desired volume generally having an inverted cup shape with a reservoir having back volume 126. With such engineering considerations in mind, the combined profile of the lid 108 defined by the inner metal skin 114, the structural core 112 and the outer metal skin 116, can range widely. In one embodiment, the combined profile (thickness) 176 ranges from having a sufficiently wide profile (from surface 160) to provide a desired thermal and acoustic isolation and sufficiently narrow to provide or maintain a desired back volume 126 (defined by interior boundary 144 of the interior metal skin 114). Advantageously, the lid 108 construction can be configured and adapted to provide improved thermal and acoustic isolation with a desired footprint and desired back volume.

Also, in one embodiment, the lid 108 can include a composite comprising a metal layer, a polymer layer and a metal layer in connection with the inner metal skin 114, the insulative structural core 112 and outer metal skin 116, respectively. The polymer can be a liquid crystal polymer (LCP). Advantageously, such a composite can provide improved RF immunity, and a durable and integrated construction adapted to withstand a harsh and/or demanding environment to which it will be exposed to. Continuing, the lid 108 with a composite construction can enhance durability and mini minimize the possibility of the layers separating, such as during normal use, temperature extremes, etc. which can cause premature degradation or failure.

In one embodiment, the "structural core" is an electrical insulator and less thermally conductive than at least the outer metal skin and in other embodiments both the inner and outer skin(s). The structural core can be a solid or non-solid material. The core can also be a porous, foam, mesh, tape or lattice structure, for example. In some sensors there is a tradeoff between reduced susceptibility to undesirable environmental effects and performance. A thicker structural core can provide better insulation, but reduces back volume since the outer dimensions of the sensor are typically constrained by design specification. A smaller back volume can adversely affect sensor performance. Core thickness as low as 25 microns has been found to provide improved performance relative to metal lids. The performance of other sensors may not be as susceptible to a reduction in back volume resulting from thickening the core. In more detail, for example, structural core materials can include Polymers, Liquid Crystal Polymers (LCP); Die Attach Film (DAF); acrylic foam tapes, e.g., 3M Very High Bond (VHB) tape, among other known and future materials. The metal skins 114 and 116 can be metal plates layered on opposite sides of the structural core by laser direct structuring (LDS), metal deposition (e.g., sputtering, electroplating)

on the core, layer stack up prior to lid forming in a drawing process, among other processes.

In one embodiment, the insulative structural core 112 is bonded or otherwise fastened at 128 and 130 to and sandwiched between at least a portion of the outer metal skin 116 and a portion of the inner metal skin 114. Bonds 128 and 130 can provide durable connections, proper layout and alignment, in proximity to the bonds 128 and 130, which can provide improved insulation. In a preferred embodiment, as shown in FIG. 1, the insulative structural core 112 is fastened to a substantial portion of the outer metal skin 116 and the inner metal skin 114, for improved insulation, secure connection and durability.

Figure 3:
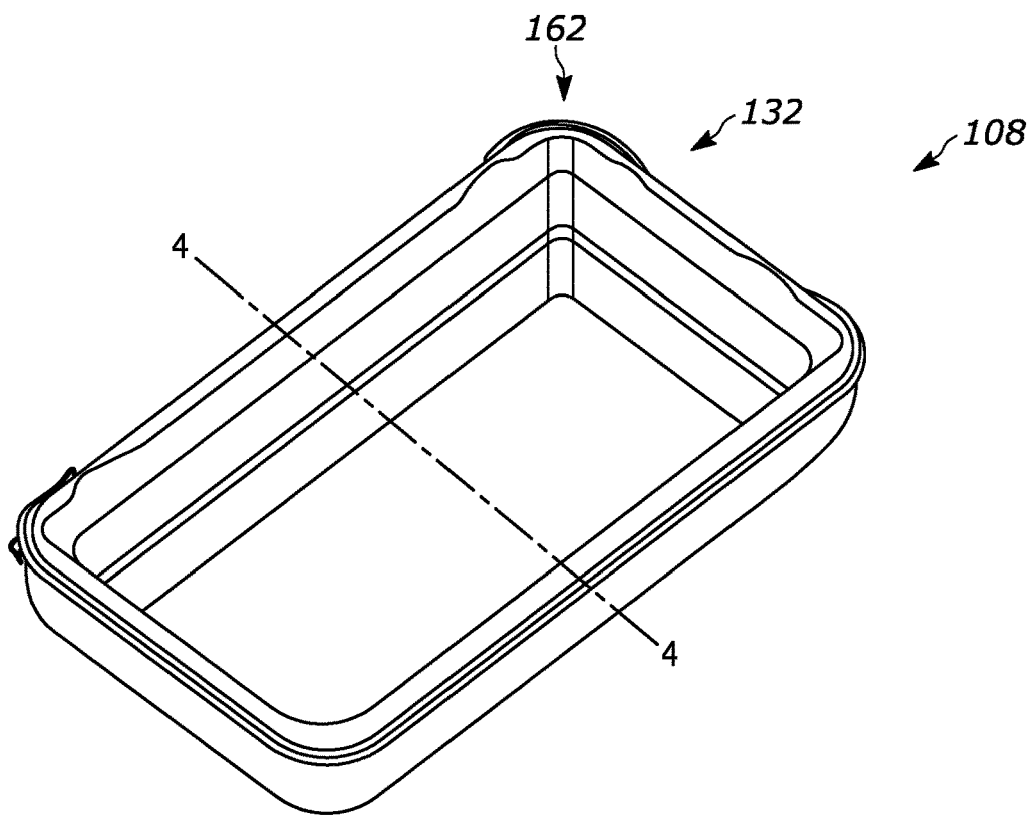
FIG. 3 is a partial perspective view of an acoustic transducer assembly including a lid in accordance with an illustrative embodiment.

As shown in FIGS. 3 and 4, the lid 108 includes a generally inverted cup shape having an open bottom 132 defining an air space and/or volume, configured to receive and enclose electronic components, with for example a low profile and minimal footprint. In more detail in FIG. 4, the inner metal skin 114 includes a generally inverted cup shape having an opening 134 defining an inner metal skin reservoir, with for example, a low profile (depth) and miniature footprint, in one embodiment.

Generally, the open end of the lid is mounted on and fastened to the base. In one implementation, the lid is soldered to a conductive portion of the base. The conductive portion can be a ground plane or other exposed conductor of the base. In some implementations, a footer is formed by a portion of the inner or outer skin folded under and electrically connected to the other skin, wherein the footer is mounted on and fastened to the base. In a more particular implementation, one or both of the inner or outer metal skins include a folded portion that extends outwardly of the lid sidewall. In FIG. 2, the inner metal skin includes a footer 142 that electrically connects and overlaps a footer 150 of the outer metal skin, wherein both footers extend outwardly of the lid sidewall. In other implementations, however, the footers do not extend beyond the sidewall of the lid. In other implementations, the metals skins are not folded to form footer sections.

In further detail, the inner metal skin 114 with opening 134 includes a middle-inner section 138, a wall section 140 and a footing section (or footer) 142. The inner metal skin forms an interior volume of the housing configured to receive and enclose electronic components, with a low profile and minimal footprint, in one embodiment.

Moving to the outer metal skin 116 shown in FIG. 4, it likewise includes a generally inverted cup shape having an opening 136 including a ceiling section 146, a wall section 148 and a footing section (or footer) 150 defining an interior boundary 152 of the outer metal skin 116. The interior boundary 152 is shown being complementarily configured and adapted to receive the insulative structural core 112 and inner metal skin 114 in a generally nested, snug and/or secure telescopic arrangement, in FIG. 4. In one embodiment, the outer metal skin 116 interior boundary 152 is larger than the inner metal skin 114. Such a construction helps to maintain a predetermined substantially uniform spacing 154 for the insulative structural core 112 between the inner metal skin 114 and the outer metal skin 116, for an improved and aligned uniform and consistent thermal insulation barrier.

As shown in the figures, in certain embodiments the middle-ceiling section 146 and the wall 148 of the outer metal skin 116 are generally parallel with the middle-ceiling section 138 and the wall section 140 of the inner metal skin 114, respectively. Advantageously, this arrangement can provide a consistent and uniform, predetermined spacing 154 for the low conductive solid core 112 to reside, to provide an improved, uniform and consistent thermal insulation barrier.

As shown in FIGS. 1 and 4, the outer metal skin 116 includes a footing section 150 electrically coupled (connection) 156 to a footing section 142 of the inner metal skin 114. The connection 156 can be a solder or reflow connection, for example. The connection 156 can be connected to a ground plane 158 and be around a substantial portion (or all) of a periphery 162 (FIG. 1) of the lid 108, for enhanced shielding and secure connection and foundation.

In one embodiment, the insulative structural core 112 comprises a polymer having a predetermined thickness to provide a desirable thermal insulation barrier and to allow the outer metal skin 116 to shed heat. In one embodiment, the thickness is at least about 25 microns. In addition, the insulative structural core 112 can include a predetermined low thermal conductivity and low electrical conductivity, to provide a desirable thermal barrier and desirable dielectric characteristics to allow the outer metal skin 116 to shed heat from the inner metal skin 114 and the contents therein, for example. In addition, a polymer is adaptable to being securely adhered to stainless steel and can withstand many temperature extremes during reflow and/or plating processes.

In one embodiment, the insulative structural core 112 includes a ceiling 164, a wall 166 and end 168 complementarily configured to be received in the predetermined spacing (gap) 154, which is sandwiched between the inner metal skin 114 and outer metal skin 116, to provide an insulative buffer, configured to promote shedding of heat from the outer metal skin 116 away from the inner metal skin 114.

In more detail, the insulative structural core 112 can comprise a layer of material having a predetermined and substantially uniform thickness to provide an insulation barrier and a low electrical conductance, sufficient to allow the outer metal skin 116 to shed heat. A low electrical conductance provides desirable dielectric characteristics (low to no metal content) to also contribute to shedding of heat and minimizing heat transfer from the outer metal skin 116 through the insulative structural core 112 to the inner metal skin 114.

In one embodiment, the insulative structural core 112 can include polymers, thermosets, polymer tape, double-sided adhesive rolls of polymer tape and the like. Advantageously, the insulative structural core 112 or appropriate material can provide improved, uniform and consistent insulative barrier to allow the outer metal skin 116 to shed heat.

In one embodiment, the structural core comprises a molded or tape polymer. Advantageously, a mold and/or tape can be easily sandwiched between the inner metal skin 114 and outer metal skin 116 for ease of assembly, for example, for an improved, uniform and consistent thermal insulation.

Figure 5:
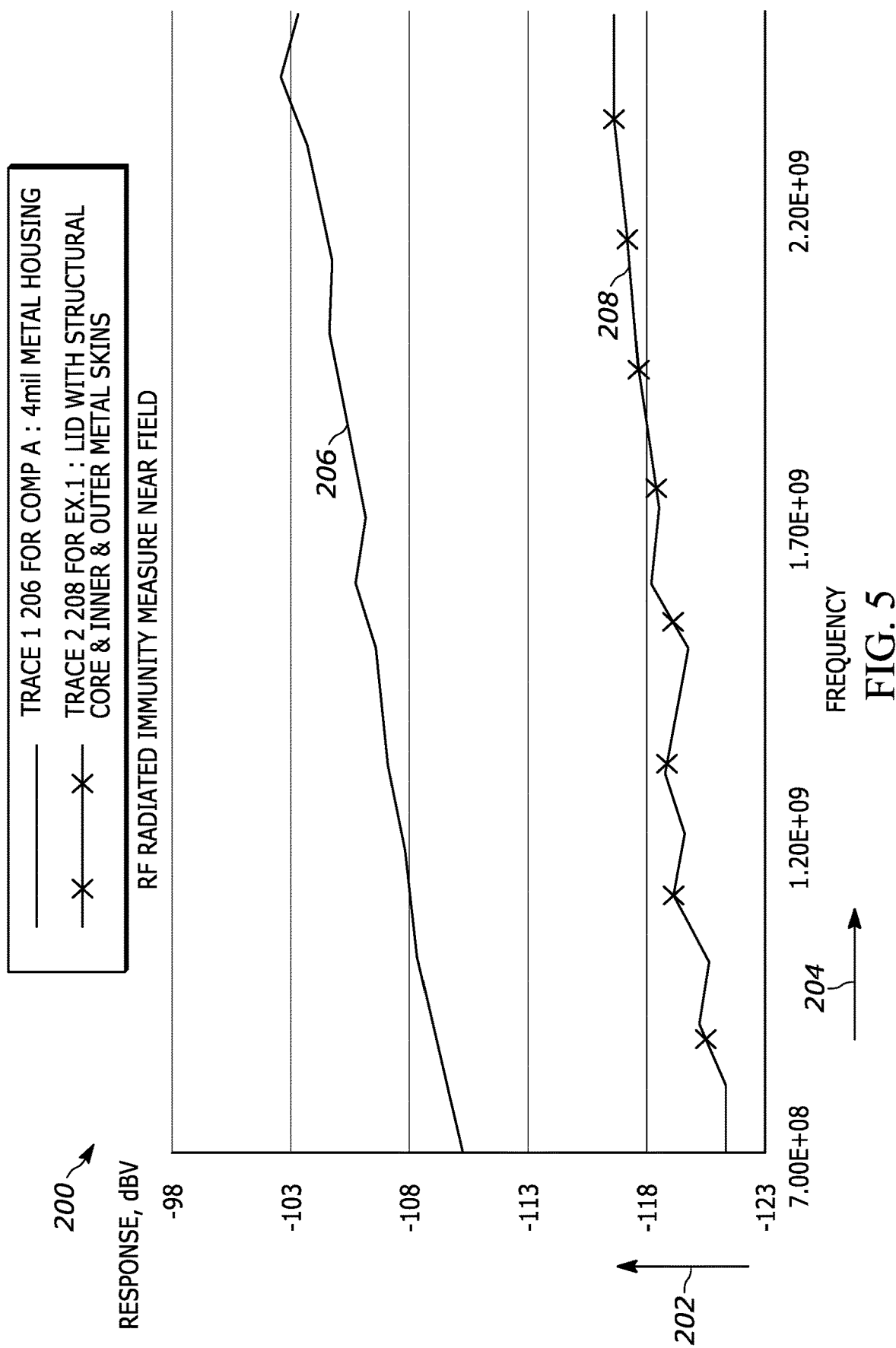
FIG. 5 provides a graph including a comparative example and an example of an embodiment of an acoustic transducer assembly in accordance with one embodiment. An RF radiated immunity measure from (a near field exposure) from a radiating element were recorded and plotted over various frequencies.

FIG. 5 provides a graph including a comparative example and an example of an embodiment of an acoustic transducer assembly in accordance with one embodiment. In FIG. 5, the graph 200 is shown including a vertical axis 202 including attenuation values and a horizontal axis 204 including various frequencies. In brief, the testing included placing a radiating element 170, above and at similar distances for Comparative Example A (Comp A) and Example 1. An RF radiated immunity measure from (a near field exposure) from a radiating element 170 to and in a back volume 126, (shown as reduced radiation arrows 174, in FIG. 1) were taken and noted on the vertical axis. Comp A included a metal housing with attenuation values plotted over various frequencies, shown as Trace 1 206. Example 1 included an insulative structural core 112 comprising liquid crystal polymer (LCP) inside and adhesively attached to a ceiling and walls of the outer and inner metal skins, 116 and 114, as substantially shown in FIG. 4. Trace 2 208 shows attenuation values plotted over various frequencies for Example 1. Example 1's trace 2 208, showed improved attenuation results (at reduced radiation arrows 174), compared to Comp A, at all frequencies shown in FIG. 5.

The subject matter described herein sometimes illustrates different components contained within, or connected with, different other components. It is to be understood that such depicted architectures are illustrative, and that in fact many other architectures can be implemented which achieve the same functionality. In a conceptual sense, any arrangement of components to achieve the same functionality is effectively "associated" such that the desired functionality is achieved. Hence, any two components herein combined to achieve aparticular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of plural and/or singular terms herein, those having skill in the art can translate from the plural to the singular and/or from the singular to the plural as is appropriate to the context and/or application. The various singular/plural permutations may be expressly set forth herein for sake of clarity. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.).

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

The invention claimed is:

1. A microelectromechanical systems (MEMS) acoustic transducer assembly comprising:
   a base having a host-device interface with a plurality of contacts;
   a composite lid mounted on the base to form a housing, the lid having a structural core between an inner metal skin and an outer metal skin, the structural core more electrically insulating and less thermally conductive than the inner and outer metal skins;
   a MEMS transduction element disposed in the housing and acoustically coupled to a sound port of the housing; and
   an integrated circuit disposed in the housing, the integrated circuit electrically coupled to the MEMS transduction element and to contacts of the host-device interface,
   wherein the structural core has a predetermined thickness between the inner skin and the outer skin, where the predetermined thickness is less than a predetermined spacing between the inner skin and the outer skin.

2. The acoustic transducer assembly in claim 1 wherein the structural core comprises a polymer disposed between the outer metal skin and the inner metal skin.

3. The acoustic transducer assembly in claim 1 wherein the structural core is fastened to and sandwiched between at least a portion of the outer metal skin and a portion of the inner metal skin.

4. The acoustic transducer assembly in claim 1 wherein the structural core is bonded to a substantial portion of the outer metal skin and the inner metal skin.

5. The acoustic transducer assembly in claim 1 wherein the structural core comprises an adhesive tape.

6. The acoustic transducer assembly in claim 1 wherein the structural core comprises a foam material.

7. The acoustic transducer assembly in claim 1 wherein the lid has a cup shape and a sidewall portion mounted on the base, wherein an opening of the lid defines an interior of the housing.

8. The acoustic transducer assembly in claim 7, the lid including a metal footer section electrically connecting the inner metal skin and the outer metal skin, wherein the footer section is mounted on and fastened to a conductive portion of the base,
   wherein the inner metal skin comprises an inner skin end section proximal to the base, the outer metal skin comprises an outer skin end section proximal to the base, and the structural core comprises a core end proximal to the base,
   wherein the inner skin end section and the outer skin end section extend past the core end at the footer section, and
   wherein the inner skin end section is directly connected to the outer skin end section.

9. The acoustic transducer assembly in claim 1 wherein the structural core has a substantially uniform thickness.

10. The acoustic transducer assembly in claim 1, wherein the inner and outer metal skins comprise a metal deposited on inner and outer surfaces of the structural core.

11. The acoustic transducer assembly in claim 1 wherein the inner and outer metal skins each comprise a metal sheet material fastened to the structural core.

12. The acoustic transducer assembly in claim 1 wherein the structural core includes a predetermined low thermal conductivity and a low electrical conductivity.

13. The acoustic transducer assembly in claim 1 wherein the structural core comprises a layer of material having a substantially uniform thickness to provide a thermal barrier and a low electrical conductance sufficient to insulate an interior of the housing from heat.

14. The acoustic transducer assembly in claim 1 wherein the core is bonded to a substantial portion of the outer metal skin and the inner metal skin.

15. The acoustic transducer assembly in claim 1 wherein the structural core comprises a tape.

16. The acoustic transducer assembly in claim 1, wherein a combined thickness of the inner metal skin, the structural core, and the outer metal skin ranges from having a sufficiently wide thickness to provide a desired thermal and acoustic isolation and sufficiently narrow to provide the interior of the housing defining a back volume.

17. The acoustic transducer assembly in claim 16, the lid including a metal footer portion electrically connecting the inner metal skin and the outer metal skin, wherein the footer portion is mounted on and fastened to a conductive portion of the base.

18. The acoustic transducer assembly in claim 17, wherein the structural core has a substantially uniform thickness.

19. The acoustic transducer assembly in claim 18, wherein the structural core comprises a liquid crystal polymer.

* * * * *